United States Patent
Subramani et al.

(10) Patent No.: US 12,505,988 B2
(45) Date of Patent: Dec. 23, 2025

(54) PLASMA CHAMBER WITH GAS CROSS-FLOW, MICROWAVE RESONATORS AND A ROTATABLE PEDESTAL FOR MULTIPHASE CYCLIC DEPOSITION

(71) Applicant: Applied Materials, Inc., Santa Clara, CA (US)

(72) Inventors: Anantha Subramani, San Jose, CA (US); Yang Guo, Fremont, CA (US); Seyyed Fazeli, Santa Clara, CA (US); Kelvin Chan, San Ramon, CA (US); Chandrashekara Baginagere, Bengaluru (IN); Brian Alvarez, Oceanside, CA (US); Philip Kraus, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 324 days.

(21) Appl. No.: 17/834,278

(22) Filed: Jun. 7, 2022

(65) Prior Publication Data
US 2023/0395356 A1 Dec. 7, 2023

(51) Int. Cl.
*H01J 37/32* (2006.01)
*C23C 16/455* (2006.01)
*C23C 16/458* (2006.01)

(52) U.S. Cl.
CPC .. *H01J 37/32449* (2013.01); *C23C 16/45536* (2013.01); *C23C 16/4584* (2013.01); *H01J 37/32247* (2013.01); *H01J 37/32715* (2013.01); *H01J 2237/162* (2013.01); *H01J 2237/20214* (2013.01); *H01J 2237/20235* (2013.01); *H01J 2237/332* (2013.01)

(58) Field of Classification Search
CPC .................................. H01J 37/32449
See application file for complete search history.

(56) References Cited

U.S. PATENT DOCUMENTS

| | | | | |
|---|---|---|---|---|
| 5,478,459 | A * | 12/1995 | Latz | H01J 37/32247 |
| | | | | 204/298.38 |
| 6,325,861 | B1 * | 12/2001 | Stinnett | H01L 21/02063 |
| | | | | 257/E21.256 |
| 6,517,634 | B2 * | 2/2003 | Pang | C23C 16/44 |
| | | | | 16/241 |
| 9,869,021 | B2 * | 1/2018 | Sferlazzo | H01L 21/68771 |
| 2003/0150560 | A1 * | 8/2003 | Kinnard | C23C 16/45504 |
| | | | | 156/345.33 |
| 2004/0026037 | A1 * | 2/2004 | Shinriki | C23C 16/45561 |
| | | | | 438/785 |

(Continued)

FOREIGN PATENT DOCUMENTS

JP 2001110728 * 4/2001 ........... H01L 21/205

*Primary Examiner* — Keath T Chen
(74) *Attorney, Agent, or Firm* — Schwabe, Williamson & Wyatt, P.C.

(57) ABSTRACT

A plasma treatment chamber comprises a chamber body having an opening in a top surface thereof. A rotatable pedestal is within the chamber body having a support surface to hold and rotate a workpiece in a processing region. A cross-flow pumping ring is over the opening in the chamber body to inject a gas flow in a direction generally parallel to and across a surface of the workpiece. A lid is over the cross-flow pumping ring, the lid having a plurality of microwave resonators to ignite the gas flow and form plasma.

7 Claims, 7 Drawing Sheets

(56) References Cited

U.S. PATENT DOCUMENTS

| | | | |
|---|---|---|---|
| 2007/0137794 A1* | 6/2007 | Qiu | C23C 16/4584 118/725 |
| 2012/0270409 A1* | 10/2012 | Kim | H01L 21/0228 438/785 |
| 2015/0340225 A1* | 11/2015 | Kim | C23C 16/455 118/728 |
| 2015/0368796 A1* | 12/2015 | Li | C23C 16/4412 137/561 A |
| 2018/0037990 A1* | 2/2018 | Kato | C23C 16/345 |
| 2020/0373187 A1* | 11/2020 | Singu | C23C 16/45544 |

* cited by examiner

PLASMA CHAMBER WITH GAS CROSS-FLOW, MICROWAVE RESONATORS AND A ROTATABLE PEDESTAL FOR MULTIPHASE CYCLIC DEPOSITION

FIELD

Embodiments of the present disclosure pertain to the field of semiconductor processing and, in particular, to a plasma chamber with gas cross-flow, microwave resonators and a rotatable pedestal for multiphase cyclic deposition.

DESCRIPTION OF RELATED ART

During a plasma etch, deposition or other treatment processes, a workpiece, such as a semiconductor wafer, is inserted to a sealed plasma reactor chamber, and gas is injected into the chamber over the wafer and then pumped from the chamber. Plasma chambers often comprise (1) a parallel plate capacitively coupled plasma (CCP) source where one electrode has the workpiece on its plasma-facing surface and the other electrode has an array of gas inlet holes (showerhead) in the plasma-facing surface or (2) an inductively coupled plasma (ICP) or microwave source with a radio-frequency (RF) window generally opposite and facing the workpiece, and an array of gas inlet holes in or near the window. With the axisymmetric gas flow approach described above, pressure & concentration gradients cause center-to-edge processing differences on the workpiece. In addition, extraneous plasma may form in gas inlet holes due to proximity to dense plasma or breakdown due to high electric fields, leading to non-uniformity changing overtime due to deformation of the gas inlet holes.

A series of cross-flow of gases from different directions laterally across a fixed wafer on a pedestal could alleviate the problems above. However, if the workpiece is fixed, a complex system may be needed to change the gas flow direction and timing for various phases.

SUMMARY

Embodiments disclosed herein include a plasma treatment chamber comprising a chamber body having an opening in a top surface thereof. A rotatable pedestal is within the chamber body having a support surface to hold and rotate a workpiece in a processing region. A cross-flow pumping ring is over the opening in the chamber body to inject a gas flow in a direction generally parallel to and across a surface of the workpiece. A lid is over the cross-flow pumping ring, the lid having a plurality of microwave resonators to ignite the gas flow and form plasma.

Embodiments disclosed herein include a method of performing a rotating gas cross-flow in a plasma treatment chamber comprising microwave resonators and a rotatable pedestal. The method comprises during a first phase, injecting, by a first gas injector in a cross-flow pumping ring, a first gas flow in a first direction generally parallel to and across a surface of a workpiece on the rotatable pedestal in a first position, and pumping out, by a first pump port in the cross-flow pumping ring, the first gas flow from the cross-flow pumping ring, wherein the first gas injector is located in a first opening in the cross-flow pumping ring, and the first pump port is located in a second opening generally opposing the first gas injector. The rotatable pedestal is then rotated to rotate the workpiece a predetermined angular distance. A second phase comprises the gas injector injecting a second gas flow generally parallel to and across the surface of the workpiece, and pumping the second gas flow out by the pump port.

Embodiments disclosed herein include a plasma treatment chamber comprising a chamber body having an opening in a top surface thereof. A rotatable pedestal is within the chamber body having a support surface to hold and rotate a workpiece in a processing region. A cross-flow pumping ring is over the opening in the chamber body to inject a gas flow in a direction generally parallel to and across a surface of the workpiece. A lid is over the cross-flow pumping ring, the lid having a plurality of microwave resonators. A multiphase rotating cross-flow operation comprising at least: a first phase comprising injecting, by a gas injector in the cross-flow pumping ring, a first gas flow generally parallel to and across a surface of the workpiece, and pumping out, by a pump port in the cross-flow pumping ring, the first gas flow. The rotatable pedestal is then rotated to rotate the workpiece a predetermined angular distance. A second phase comprises the gas injector injecting a second gas flow generally parallel to and across the surface of the workpiece, and pumping the second gas flow out by the pump port.

DETAILED DESCRIPTION

Figure 1A:
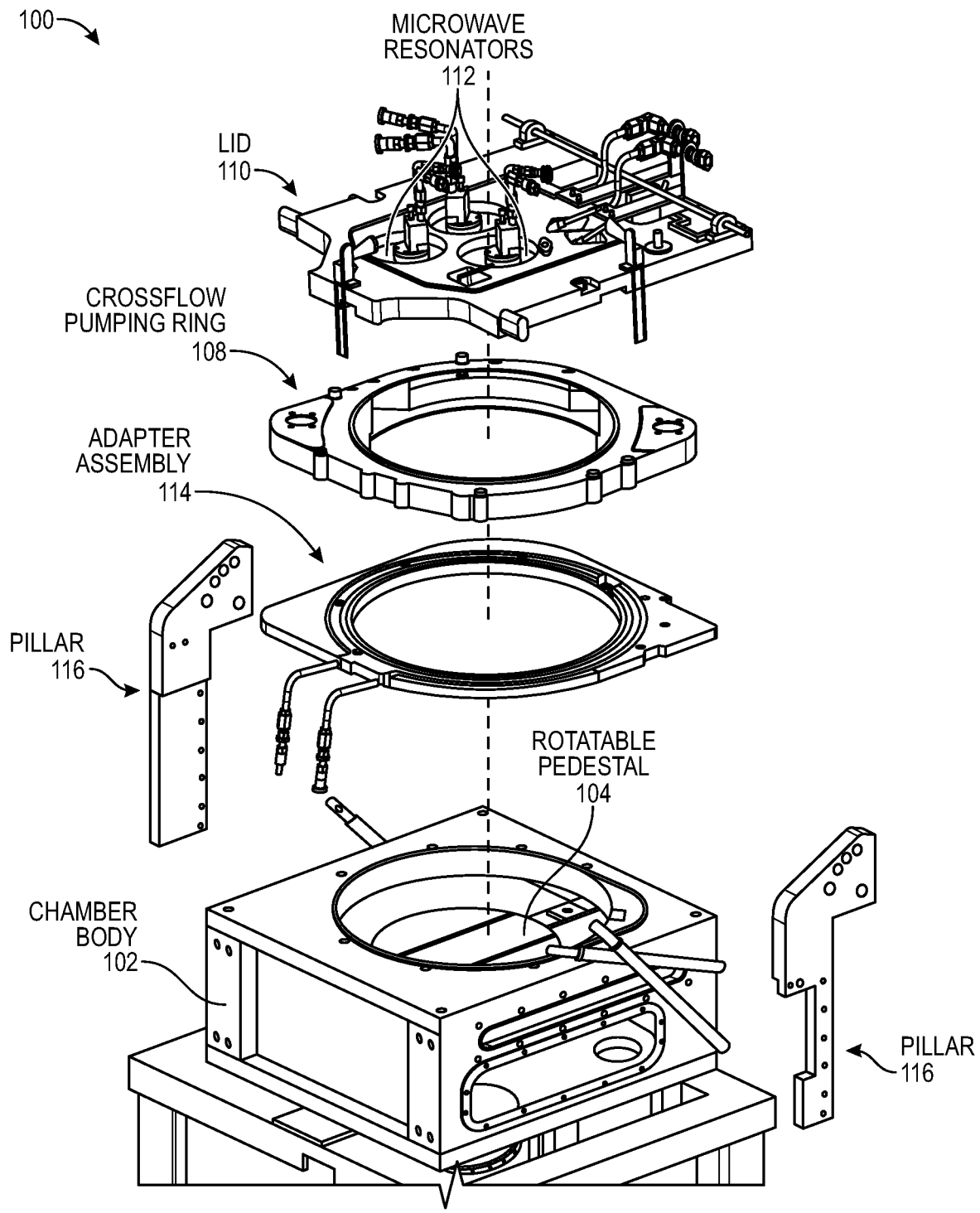
FIGS. 1A-1C are diagrams illustrating embodiments of a plasma treatment chamber of a plasma reactor having microwave resonators and a rotatable pedestal in combination with a multiphase rotating cross-flow.

The disclosed embodiments relate to a plasma chamber having a gas cross-flow, microwave resonators, and a rotatable pedestal to provide a multiphase cyclic deposition. In the following description, numerous specific details are set forth, in order to provide a thorough understanding of embodiments of the present disclosure. It will be apparent to one skilled in the art that embodiments of the present disclosure may be practiced without these specific details. In other instances, well-known aspects, such as integrated circuit fabrication, are not described in detail in order to not unnecessarily obscure embodiments of the present disclosure. Furthermore, it is to be understood that the various embodiments shown in the Figures are illustrative representations and are not necessarily drawn to scale.

Traditional plasma chambers (i.e., CCP or ICP) typically inject gas axisymmetrically over a workpiece from gas inlet holes that are typically located directly above the workpiece or symmetrically around its periphery. As noted above, axisymmetric gas flow can result in pressure and concentration gradients and the gas hole inlets may breakdown, creating non-uniformities in the workpiece. Flowing a series of gases from different directions laterally across a fixed wafer on a pedestal could alleviate such problems, but may require systems and controls to change the gas flow direction and timing for the various phases.

Accordingly, embodiments disclosed herein are directed to a plasma chamber (e.g., CCP or ICP) with gas cross-flow, microwave resonators and a rotatable pedestal for multi-phase cyclic deposition. The plasma treatment chamber comprises a chamber body having an opening in a top surface thereof. A pedestal is within the chamber body having a support surface to hold a workpiece in a processing region, the pedestal further including a lift mechanism to raise and lower the workpiece, and a rotation assembly that rotates the pedestal and the workpiece. A cross-flow pumping ring is over the opening in the chamber body to inject a gas flow in a direction generally parallel to and across a surface of the workpiece. A lid is over the cross-flow pumping ring, the lid having a plurality of microwave resonators to ignite the gas flow and form plasma.

The plasma treatment chamber is configured to start a first gas flow laterally across the workpiece in first position and stop the first gas flow after a first period of time. The rotatable pedestal then rotates the workpiece to a second position and a second gas flow is started laterally across the workpiece and then stopped after a second period of time. This process may continue for any number of cycles. Therefore, the plasma treatment chamber provides a multiphase rotating cross-flow operation comprising at least a 2-phase cycle. In one embodiment, the multiphase rotating cross-flow operation is used to perform a chemical vapor deposition (CVD) process on the workpiece.

In one embodiment, the plasma treatment chamber with gas cross-flow, microwave resonators and a rotatable pedestal eliminates the need for showerheads (and gas inlet holes) in the dense, high IEI plasma regions, and therefore prevents the source of plasma non-uniformity, while reducing complexity required to control the various gas cross-flow phases.

Figure 1B:
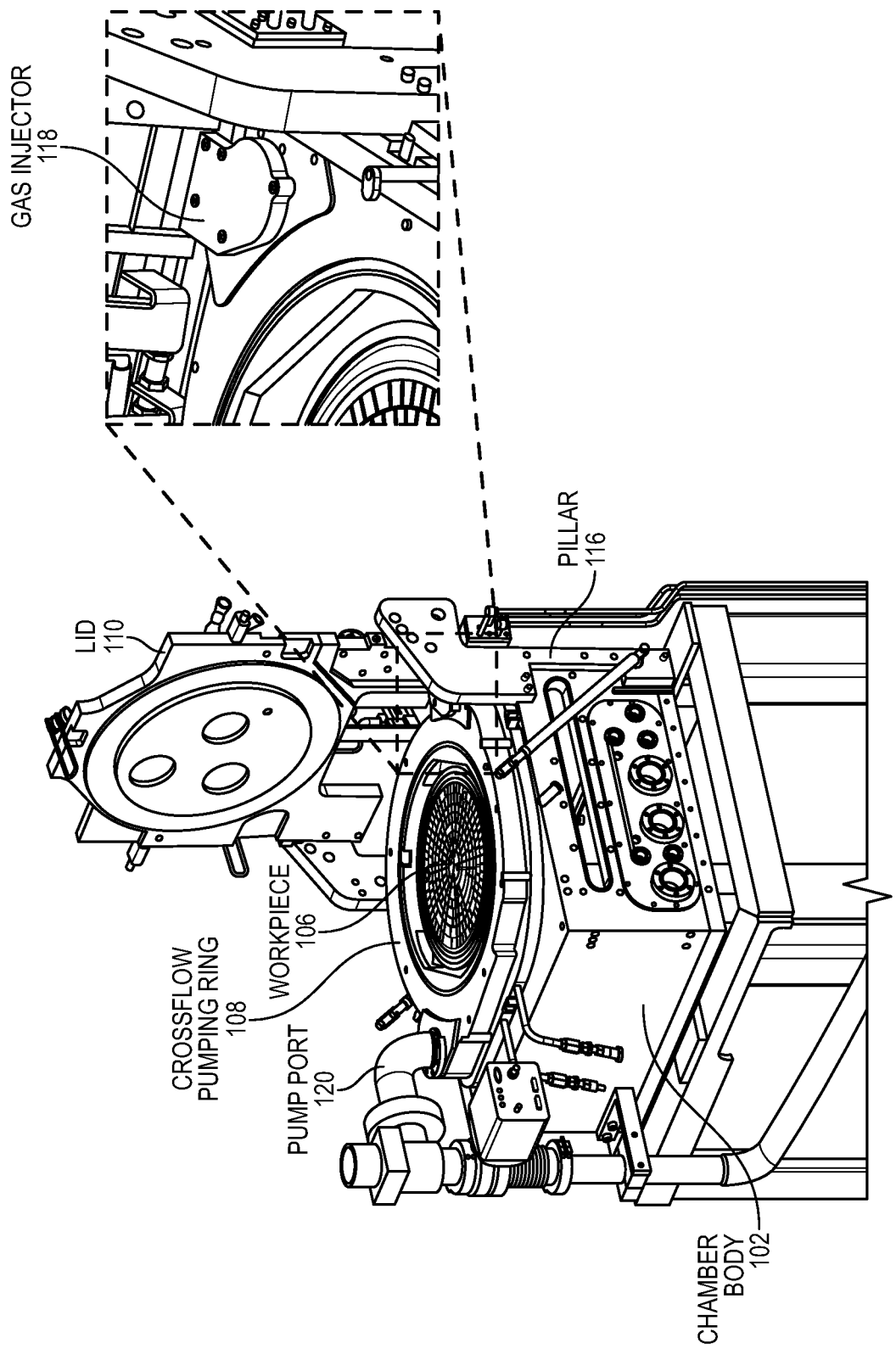
Figure 1C:
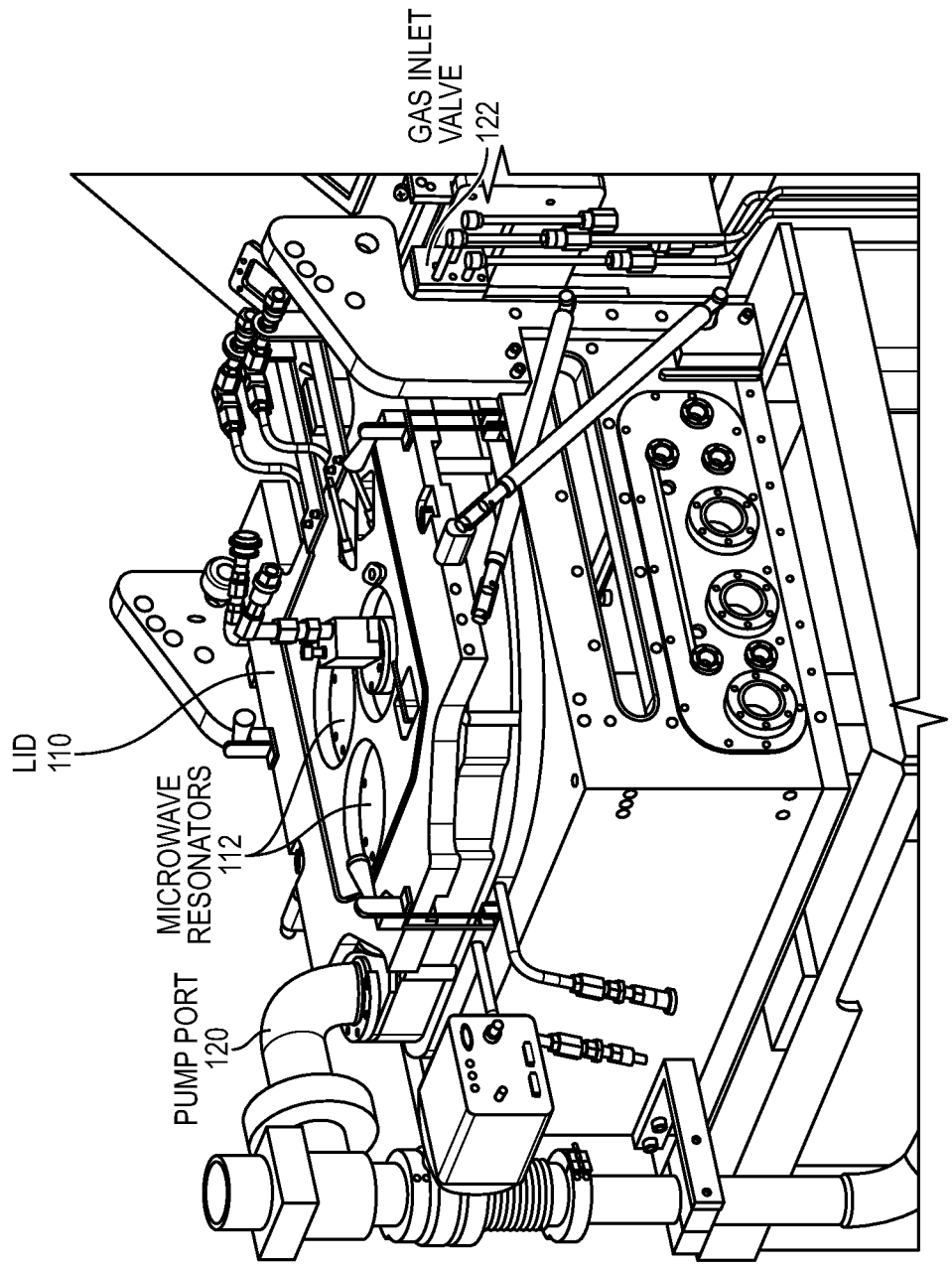

FIGS. 1A-1C are diagrams illustrating embodiments of a plasma treatment chamber of a plasma reactor having microwave resonators and a rotatable pedestal in combination with a multiphase rotating cross-flow. FIG. 1A is a diagram illustrating an angled, exploded view of the plasma treatment chamber having a multiphase rotating cross-flow operation according to one embodiment. FIGS. 1B and 1C illustrate angled views of the plasma treatment chamber in a lid open and closed position, respectively.

Referring to FIGS. 1A-1C, the plasma treatment chamber 100 comprises a chamber body 102 having an opening in a top surface thereof and a rotatable pedestal 104 within the chamber body 102. As shown in FIG. 1B, the rotatable pedestal 104 has a support surface to hold and to rotate a workpiece 106 (e.g., a semiconductor wafer) in a processing region for treatment. As described below, the rotatable pedestal 104 may include a rotation assembly that rotates the pedestal 104 and the workpiece 106, and a lift mechanism that raises and lowers the workpiece 106. A cross-flow pumping ring 108 is over the opening in the chamber body 102 to inject a gas flow in a direction generally parallel to and across a surface of the workpiece 106. A lid 110 is over the cross-flow pumping ring 108 and houses a plurality of microwave resonators 112 to ignite the gas flow and form plasma.

In the case where the cross-flow pumping ring 108 and the chamber body 102 are physically incompatible, an adapter assembly 114 may be located between the chamber body 102 and the cross-flow pumping ring 108 to aid in mounting the cross-flow pumping ring 108 the chamber body 102. In another embodiment, features of the adapter assembly 114 that enable coupling to the chamber body 10 to may be incorporated on the cross-flow pumping ring 108. The plasma treatment chamber 100 may further include a pair of pillars 116 located on opposing sides of the chamber body 102 to mount hinges for the lid 110 to allow the lid to open and close as shown in FIGS. 1A-1C.

FIG. 1B shows the plasma treatment chamber 100 with the lid 110 open 900 and the workpiece 106 is shown supported by the rotatable pedestal 104. The chamber body 102 is shown with a square or a rectangular shape, but oval and cylindrical shapes are also possible. The opening in the top surface of the chamber body 102 may be circular or oval, but are shapes are also possible.

The rotatable pedestal 104 may include a support surface on which the workpiece 106 is placed. In embodiments, the rotatable pedestal 104 and the support surface are rotatable, and the workpiece 106 affixed thereto is also rotated during processing. In an embodiment, the workpiece 106 is electrostatically affixed to the support surface. In another embodiment, the support surface is moveable in the axial direction for plasma gap adjustment or wafer transfer. A processing region in the plasma treatment chamber 100 is defined by an area between the chamber lid 110, the rotatable pedestal 104 (with a support surface), and sidewalls of the cross-flow pumping ring 108. The rotatable pedestal 104 is below the chamber lid 110 and above a floor of the chamber body 102. In embodiments, the chamber lid 110 and the support surface of the rotatable pedestal 104 may be separated by distance of approximately 25 mm-200 mm.

In an embodiment, the workpiece 106 may comprise any substrate that is commonly used in semiconductor manufacturing environments. For example, the workpiece may comprise a semiconductor wafer. In an embodiment, semiconductor materials may comprise, but are not limited to, silicon or III-V semiconductor materials. The semiconductor wafer may be a semiconductor-on-insulator (SOI) substrate in some embodiments. Typically, semiconductor wafers have standard dimensions, (e.g., 200 mm, 300 mm, 450 mm, or the like). However it is to be appreciated that the workpiece 106 may have any dimension. Embodiments may also include workpieces that comprise non-semiconductor materials, such as glass or ceramic materials. In an embodiment, the workpiece 106 may comprise circuitry or other structures manufactured using semiconductor processing equipment. In yet another embodiment, the workpiece 106 may comprise a reticle or other lithography mask object.

FIG. 1C further shows the lid 110 with the microwave resonators 112 in the closed position over the cross-flow pumping ring 108. Also shown is a gas inlet valve 122 (e.g., piezoelectric valves and the like), which is coupled to gas injector 118 to modulate the gas flows.

The plasma treatment chamber 100 may be used to perform a variety of treatments to the workpiece 106, such as etching, deposition, surface treatment or material modification, by distributing gases inside the chamber. In one embodiment, plasma treatment chamber 100 may comprise a plasma enhanced chemical vapor deposition chamber (CVD). In other embodiments, the plasma treatment chamber 100 may comprise but is not limited to, a plasma etch chamber, an ion implantation chamber, an atomic layer deposition (ALD) chamber, an atomic layer etch (ALE) chamber, or other suitable vacuum processing chamber to fabricate various devices.

In a further embodiment, the support pedestal 108 shown in both FIGS. 1B an 1C may electrostatically retain workpiece 116, such as substrate. The pedestal 108 may comprise one or more sub-components, such as for example one or more electrostatic chucking electrodes, biasing electrodes, and/or heating elements. The pedestal 108 may generally comprise an electrostatic chuck and a hollow support shaft (not shown) for supporting the electrostatic chuck. The hollow support shaft may provide a conduit to provide, for example, process gases, fluids, coolants, a chucking power supply, RF sources (e.g., RF plasma power supply and RF bias power supply), or the like, to the to the pedestal 108. In some embodiments, the hollow support shaft may be coupled to a lift mechanism (not shown) to provide vertical movement of the pedestal 108 between an upper, processing position and a lower, transfer position.

Figure 2A:
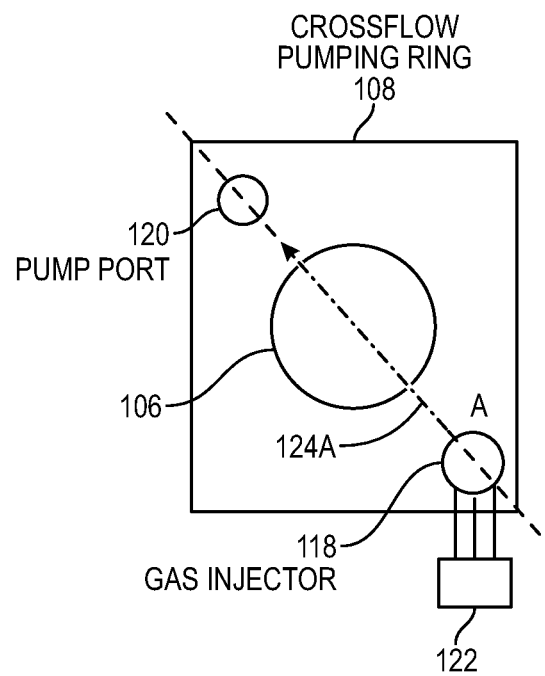
FIGS. 2A and 2B illustrate top views of the cross-flow pumping ring showing a direction of the gas flow in a multiphase rotating cross-flow operation.
Figure 2B:
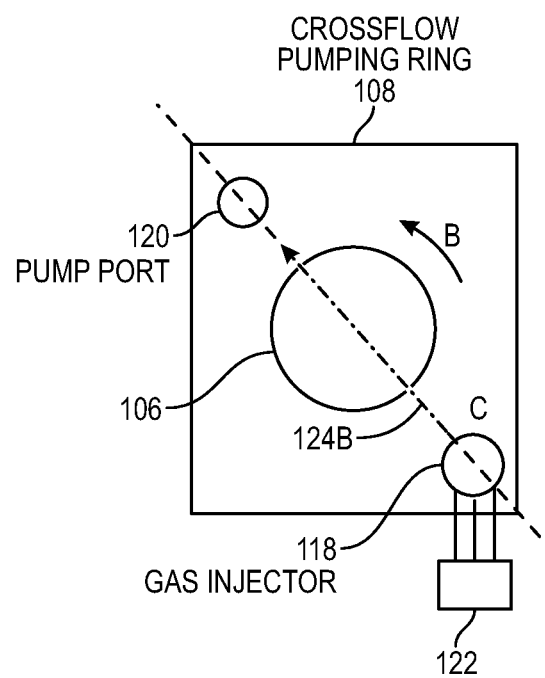

FIGS. 2A and 2B illustrate top views of the cross-flow pumping ring showing a direction of the gas flow in a multiphase rotating cross-flow operation. Referring to FIG. 2A, the plasma treatment chamber 100 is configured to use the rotatable pedestal 104, the gas injector 118, and the pump port 120, to rotate gas flows laterally across the workpiece 106 to provide a multiphase rotating cross-flow operation. Referring to FIG. 2A, at operation A, the plasma treatment chamber 100 is configured to start a first gas flow 124A laterally across the workpiece in a first position, pump out the first gas flow 124A using the pump port 120, and stop the first gas flow 124A.

Referring to FIG. 2B, in operation B, the pedestal 104 is used to rotate the workpiece a predetermined angular distance (e.g., 90°, but generally 1°-180°) to a second position. The rotation of the workpiece can be considered as the end of the first phase when the first gas flow is injected, or the beginning of a second phase when a second gas flow is injected.

In operation C, a second gas flow 124B is started laterally across the workpiece 106, pumped out, and then stopped, to provide a multiphase rotating cross-flow operation comprising at least a 2-phase cycle. In one embodiment, the multiphase rotating cross-flow operation comprises at least a 2-phase cycle, and may comprise a 3-phase cycle, a 4-phase cycle, and so on, wherein each phase the pedestal 104 rotates the workpiece 106 and gas is injected from one side of the cross-flow pumping ring 108 and pumped out generally from an opposite side by the pump ports 120. Rotation of gas flow laterally across the workpiece 106 may result in improved control of gas velocity and pressure gradients leading to better process uniformity across a wafer and from wafer-to-wafer.

In one embodiment, a modulating function may be applied to a flow rate of at least one of the first and second gas flows by the gas inlet valve 122 or applied to an outlet conductance caused by the pump port 120.

Figure 3A:
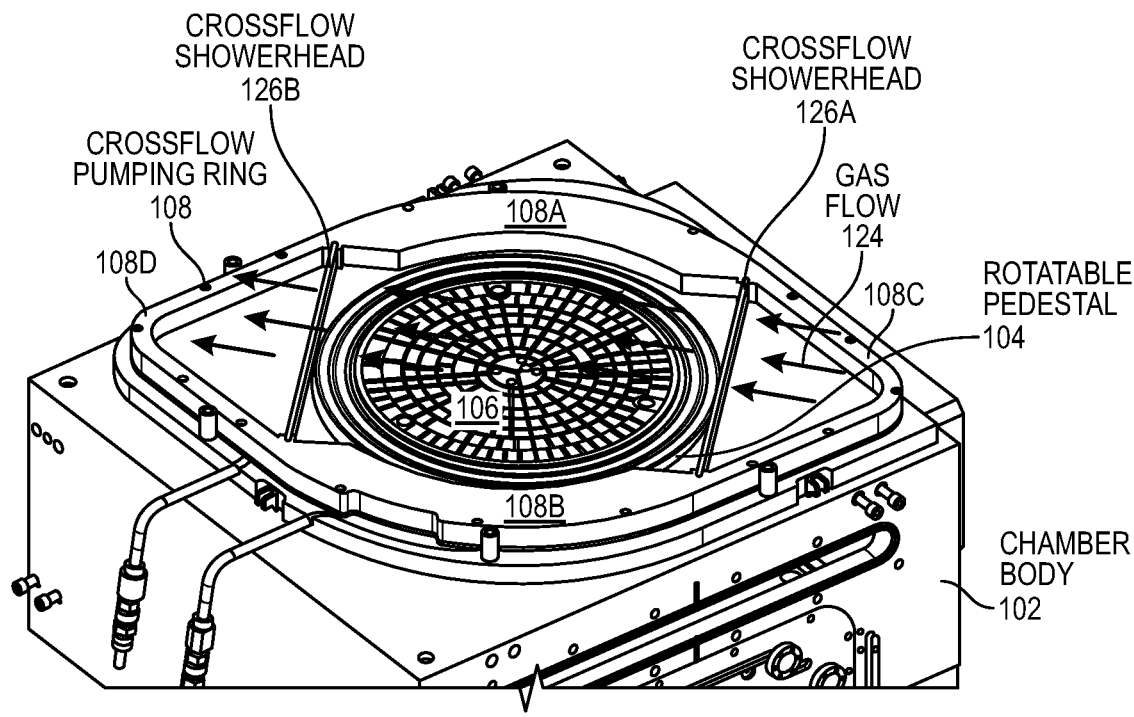
FIG. 3A illustrates an angled top view of the cross-flow pumping ring with a top portion of the cross-flow pumping ring removed to show the gas flow across a surface of the workpiece.
Figure 3B:
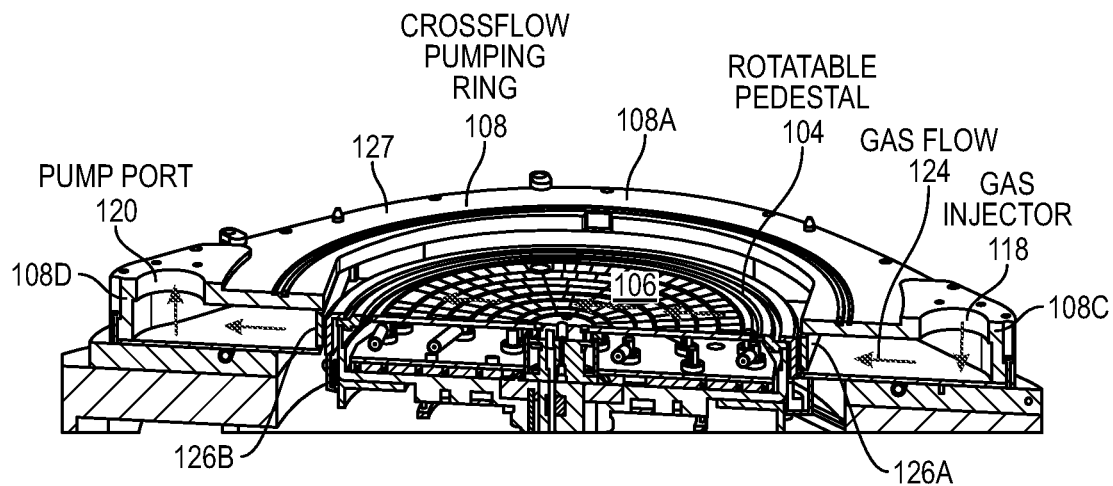
FIG. 3B illustrates an angled cross-sectional view of the cross-flow pumping ring with the top portion of the cross-flow pumping ring removed.

FIG. 3A illustrates an angled top view of the cross-flow pumping ring with a top portion of the cross-flow pumping ring removed to show the gas flow across a surface of the workpiece. FIG. 3B illustrates an angled cross-sectional view of the cross-flow pumping ring also with the top portion of the cross-flow pumping ring removed.

The cross-flow pumping ring 108 comprises a top, a bottom, and one or more sidewalls. In one embodiment, the cross-flow pumping ring 108 has a shape generally matching the shape of the opening in the top of the chamber body 102, e.g., the cross-flow pumping ring 108 may comprise one sidewall forming a cylindrical or oval shape, or multiple sidewalls forming a square or a rectangular shape. In the embodiment where the cross-flow pumping ring 108 has a square or rectangle shape, as shown in FIGS. 2A and 2B, the gas injector 118 and pump port 120 may be located in opposing corners of the cross-flow pumping ring 108.

FIGS. 3A and 3B illustrate a specific embodiment in which the cross-flow pumping ring 108 has two opposing curved corners 108A and 108B that wrap around the circular shape of the rotatable pedestal 104, and two opposing right angled corners 108C and 108D connected to the curved corners 108A and 108B. Providing the cross-flow pumping ring 108 with at least two right angled corners 108C and 108D provides sufficient space for housing the gas injector 118 and the pump port 120, respectively, as shown in FIG. 3B.

In one embodiment, both the gas injector 118 and the pump port 120 are formed in openings in the top or the one or more sidewalls of the cross-flow pumping ring 108. FIG. 3B shows gas injector 118 located in a first opening in the top of a first corner 108C of the cross-flow pumping ring 108 to inject a first gas flow in a first direction generally parallel and across the surface of the workpiece 106. The pump port 120 is located in a second opening in the top of a second corner 108D generally opposite to the first corner to pump out the gas flow from the cross-flow pumping ring 108. In one embodiment, generally parallel means within approximately 0° to 15°, and generally opposite means within approximately 0° to 30°.

Although the cross-flow pumping ring 108 has been described with one gas injector 118 and an opposing pump port 120, i.e., a gas injector and pump port pair, in other embodiments the cross-flow pumping ring 108 may comprise more than one gas injector and pump port pair. For example, although not shown the cross-flow pumping ring 108 may include a second gas injector located in a third opening in the top or the one or more sidewalls of the cross-flow pumping ring to inject a second gas flow in a second direction generally parallel to and across the surface of the workpiece, where the second direction different from the first direction. A second pump port may be located in a fourth opening in the top or the one or more sidewalls generally opposite of the second gas injector to pump out the second gas flow.

While in some embodiments the number of gas injectors 118 and pump ports 120 is equal (a single gas injector associated with a single pump port, as depicted), in other embodiments, the number of gas injectors 118 and pump ports 120 may differ. For example, in other embodiments an array of gas injectors may be associated with a single pump port, or a single gas injector may be associated with an array of pump ports.

In embodiments, the gas flow 124 of each cross-flow phase can be switched on and off to control gas flow rotation. In another embodiment, instead of switching the gas flow 124 on and off, a modulating function may be applied to a flow rate of the gas flows 124 from the gas injectors 118 and/or to an outlet conductance (or pressure) caused by the pump ports 120 to either approximate open/closed states or to ramp between states. For example, the modulating function may be sinusoidal. A flow rate of one or both of the first and second gas flows 124A and 124B can be modulated using one or more gas inlet valves 122 (e.g., piezoelectric valves) that are coupled to the gas injector 118. In some embodiments pump port conductance (pressure) may be modulated using a pressure control valve (not shown) on the pump ports 120. Although not shown the pump port 120 may be coupled to a pump to evacuate the gas. In one embodiment, the pressure control valve may comprise a throttle valve.

Many different variations between the gas flow phases and cycles may occur. That is each parameter controlling operation of the plasma treatment chamber may vary across phases and cycles. For example, the time to complete a full cycle may be the same or different across different cycles. The time to complete a phase may be the same or different within a cycle, and may be the same or different across different cycles. The direction of gas flow rotation (e.g., clockwise, counterclockwise) may be the same or different within phases of a cycle, may be non-sequential, or may be the same or different across cycles. The velocity of the gas flows may be the same or different within phases of a cycle, or may be the same or different across cycles.

According to a further aspect of the disclosed embodiment, the cross-flow pumping ring 108 may further include at least one cross-flow showerhead located substantially perpendicular to the gas flow. For example, the cross-flow pumping ring 108 may include an inlet cross-flow showerhead 126A located between the rotatable pedestal 104/workpiece 106 and the gas injector 118, and/or may include an outlet cross-flow showerhead 126B located between the rotatable pedestal 104/workpiece 106 and the pump port 120. Both the inlet cross-flow showerhead 126A and the outlet cross-flow showerhead 126B (collectively referred to as cross-flow showerheads 126) include a plurality of slots therein. One function of the inlet cross-flow showerhead 126A is to distribute injected gas across the workpiece 106. One function of the outlet cross-flow showerhead 126B is to prevent plasma from entering the pump port 120. In one embodiment, the cross-flow showerheads 126 are located on an interior bottom of the cross-flow pumping ring 108 and extend upwards to meet an interior top portion 127 of the cross-flow pumping ring 108 so that the gas flow 124 is channeled through the cross-flow showerheads 126.

Figure 3C:
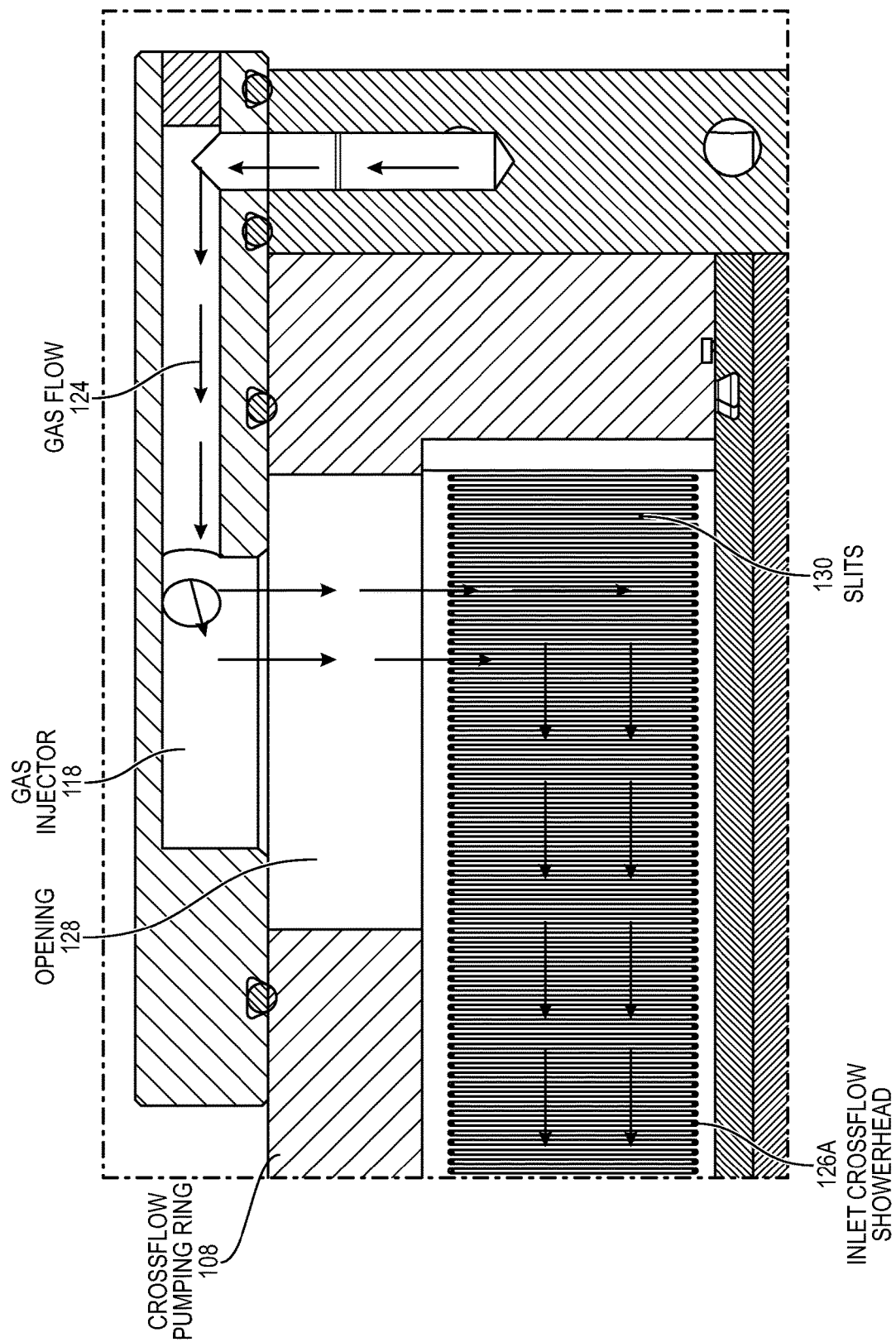
FIG. 3C illustrates a cross-section view of a portion of the gas injector and the inlet cross-flow showerhead of the cross-flow pumping ring.

FIG. 3C is a cross-section view of a portion of the gas injector 118 and the inlet cross-flow showerhead 126A of the cross-flow pumping ring 108. The gas injector 118 is shown injecting gas flow 124 into an opening 128 in the top of the cross-flow pumping ring 108 and down into the processing region where the gas flow 124 travels laterally through slots 130 in the inlet cross-flow showerhead 126A. In one embodiment, the slots 130 in the cross-flow showerheads 126 may be arranged in columns and have a height that extends substantially a height of the cross-flow showerheads 126, as shown. In yet another embodiment, the slots 130 may be arranged in rows and may have a length that extends substantially a length of the cross-flow showerheads 126. In other embodiments, the slots may comprise an array of apertures, e.g., holes or slits, arranged in a horizontal, vertical, or diagonal pattern.

In a further aspect, the cross-flow showerheads 126 may have varying sized slots 130 to vary uniformity. The cross-flow showerheads 126 may be divided into a plurality of regions that have different sized or differently shaped slots 130. For example, the cross-flow showerheads 126 may include a center region and two edge regions where the center slots that are larger than edge slots, or vice versa. In one example embodiment, the slots should be less than 0.7 mm.

As described above, the plasma treatment chamber 100 of the disclosed embodiments injects gas generally parallel and across the workpiece 106. This is in contrast to a typical axisymmetric top-down gas flow injection from a "showerhead" electrode in a CCP source reactor, and in contrast to a radial outward/downward gas injection from a nozzle array near a central axis in an ICP or microwave source reactor. In addition, instead of a pump port or pumping plenum located axisymmetrically around the periphery of the workpiece, in embodiments, gas is preferentially pumped out from a side of a workpiece generally opposite the injection side.

Figure 4:
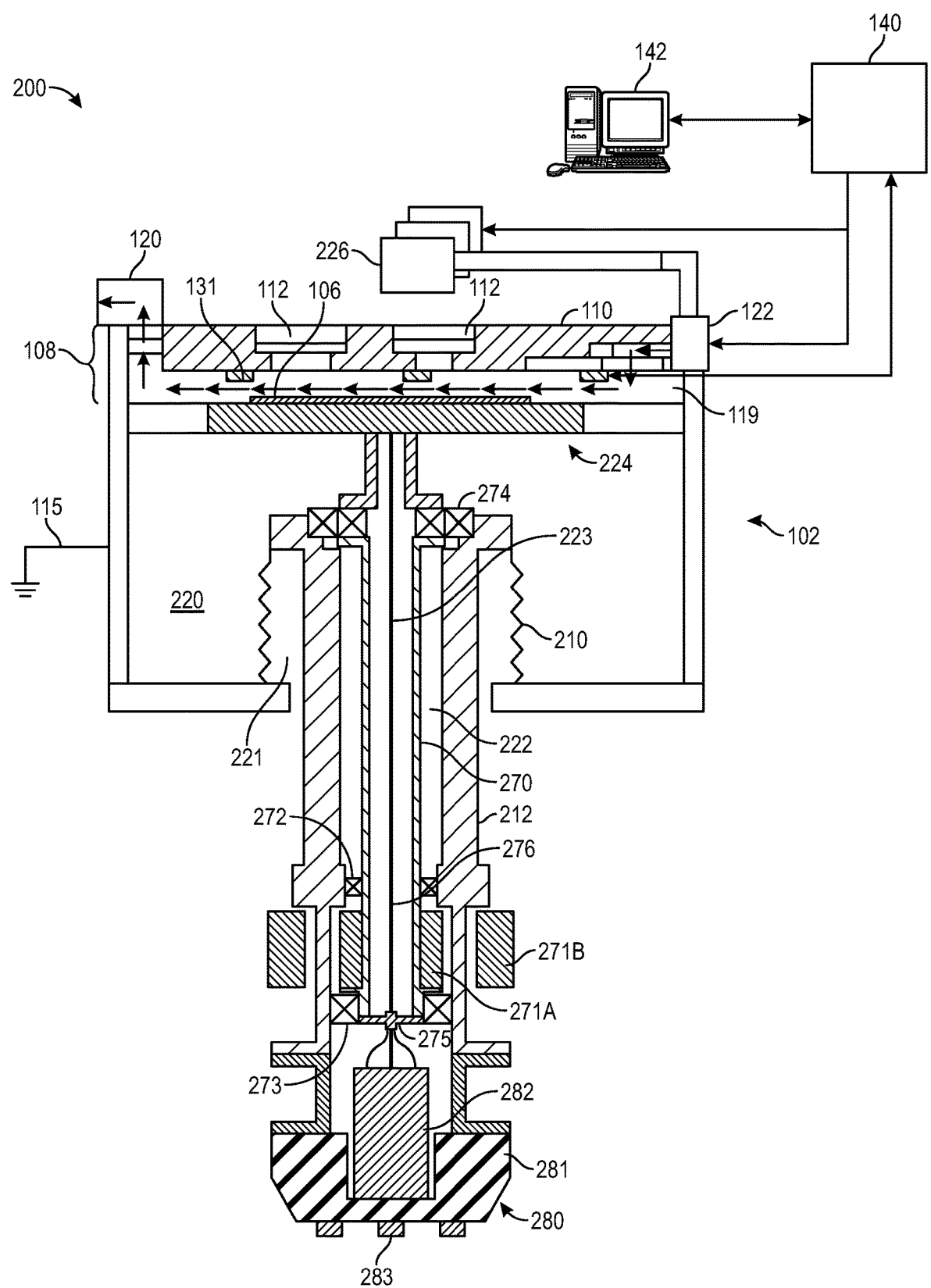
FIG. 4 illustrates a cross-sectional view of a plasma treatment chamber showing additional detail of the rotatable pedestal and associated components in accordance with an embodiment.

Referring now to FIG. 4, a cross-sectional illustration of a plasma treatment chamber 200 showing additional detail of the rotatable pedestal 224 and associated components shown in accordance with one embodiment. The chamber 200 includes a chamber body 102 covered by the cross-flow pumping ring 108. A lid 110 is over the cross-flow pumping ring 108 to form a processing region 119 in the cross-flow pumping ring 108. Microwave resonators 112 are also shown in the lid 110. The chamber body 102 and lid 110 may be made of metal, such as aluminum. The chamber body 102 may be grounded via a coupling to ground 115.

In embodiments, the gas inlet valve 122 is coupled to one or more gas sources 226, such that a single type of gas, or a mixture of different types of gases, may be injected into the processing region during each rotation phase. In one embodiment, a constant total gas flow may be applied by the gas injectors 118 to smoothly and sequentially inject the gas flows across the different sides of the workpiece 106 in a complete cycle, which may then be repeated as necessary. In one embodiment, the workpiece 106 may be rotated even while the gas flow is being injected.

In some embodiments, the plasma treatment chamber 100 may further include sensors 131 and systems to monitor process chamber conditions including gas flow, velocity, pressure, temperature and the like, with high sensitivities and real time measurement. Particular embodiments can include capacitive wall sensors, on-chip or off-chip thermal sensors, pressure sensors, and/or integrated sensors (capacitive sensors and thermal sensors) on substrates such as ceramic substrate or glass or silicon or flexible substrates. In some embodiments, the sensors can be distributed throughout the chamber to monitor the chamber conditions at various locations, which then can be correlated to overall process performances such as etch rate, etch non-uniformity, particle generation, process drifting, pressure uniformity, etc. In one embodiment, a plurality or an array of pressure sensors can be distributed throughout the chamber to provide data regarding gas flow (e.g., rotation rates, uniformity, velocity) during processing.

As shown, the pedestal 224 may support a workpiece 106, such as substrate, which may be electrostatically retained. The pedestal 224 may comprise one or more sub-components, such as for example one or more electrostatic chucking electrodes, biasing electrodes, and/or heating elements. The pedestal 224 may generally comprise an electrostatic chuck and a hollow support shaft 212 (also referred to as a first shaft) for supporting the electrostatic chuck. The hollow support shaft 212 provides a conduit to provide, for example, process gases, fluids, coolants, a chucking power supply, RF sources (e.g., RF plasma power supply and RF bias power supply), or the like, to the to the pedestal 224. In some embodiments, the hollow support shaft 212 is coupled to a lift mechanism (not shown), which provides vertical movement of the pedestal 224 between an upper, processing position and a lower, transfer position.

The plasma treatment chamber 200 may be connected to a controller 140, which in turn may be connected to a user interface 142. In some embodiments, the controller may be coupled to the gas inlet valve 122, the gas sources 226, the sensors 131, the pedestal 224, pumps, and power supplies to control operation of the plasma treatment chamber 200. A user may set process parameters and monitor operation of the plasma treatment chamber 100 through the controller 140 from the user interface 142.

An interior volume 220 of the chamber 200 may be configured to be maintained at a sub-atmospheric pressure using throttle valves, vacuum pumps, and the like. Such components are omitted from FIG. 2 for simplicity. In an embodiment, a pressure within the interior volume 220 may be approximately 100 Tor or less. In a particular embodiment, the pressure within the interior volume 220 may be between approximately 3 Tor and approximately 100 Tor. In an embodiment, a hollow support shaft (also referred to as a hollow support shaft 212) may pass through a bottom of the chamber 200.

In order to maintain the seal of the chamber 200, a baffle structure 210 may be provided between the hollow support shaft 212 and the chamber 200 to provide a flexible seal that allows vertical motion of the electrostatic chuck, while preventing loss of vacuum from within the chamber. That is, a region 221 between the exterior of the baffle structure 210 and the hollow support shaft 212 is at atmospheric pressure. The baffle structure 210 allows for the pedestal 224 to be vertically displaced by the lift mechanism.

In an embodiment, the hollow support shaft 212 may remain stationary while a second shaft 270 within the hollow support shaft 212 is rotated. The rotation of the second shaft 270 relative to the hollow support shaft 212 may be aided by the presence of one or more bearings 272, 273, and 274 between the hollow support shaft 212 and the second shaft 270. In a particular embodiment, the bearing 274 may be a cross-roller bearing 274. In an embodiment, a region 222 between the exterior of the second shaft 270 and an interior of the hollow support shaft 212 may be held at the sub-atmospheric pressure (which may be referred to as a vacuum pressure). In a particular embodiment, the region 222 may have a pressure less than 10 Tor. For example, the region 222 may have a pressure between approximately 1 Tor and approximately 10 Tor.

In an embodiment, the second shaft 270 may be rotated with any suitable driving architecture. In the particular embodiment shown in FIG. 2, the driving architecture is a magnetic architecture. As shown, one or more interior magnets 271A are attached to the second shaft 270 and outer magnets 271B are provided outside of the hollow support shaft 212. In an embodiment, the outer magnets 271B are rotated around the hollow support shaft 212 with any suitable mechanism. For example, the outer magnets 271B may be driven by a belt drive or a motor (not shown). Rotating the outer magnets 271B drives the inner magnets 271A, the second shaft 270, and the pedestal 224. Because the inner magnet 271A is disposed within the hollow support shaft 212, the inner magnet 271A is at vacuum pressure, and because the outer magnet 271B is disposed outside of the hollow support shaft 212, the outer magnet 271B is at atmospheric pressure. However, both the inner magnet 271A and the outer magnet 271B may instead be disposed within the hollow support shaft 212.

In an embodiment, a plurality of wires 276 may be fed through a vacuum feedthrough 275. While a single wire 276 is shown within the second shaft 270, it is to be appreciated that two or more wires 276 may pass through the vacuum feedthrough 275 and into the second shaft 270. The interior volume 223 of the second shaft 270 may be at atmospheric pressure in some embodiments. In some embodiments, the interior volume 223 may be at a pressure higher than atmospheric pressure. The higher pressure (e.g., at atmospheric pressure or above) prevents breakdown within the interior volume 223.

In an embodiment, the wires 275 may extend out of an RF rotary feedthrough 280. The RF rotary feedthrough 280 may include a stator 281 and a rotor 282. That is, the stator 281 remains stationary (coupled to the hollow support shaft 212), and the rotor 282 is free to rotate with the inner second shaft 270. The RF rotary feedthrough 280 may have any number of electrical pathways that allow for propagating power across a junction between a stationary component (i.e., the stator 281) and a rotating component (i.e., the rotor 282). The construction of the RF rotary feedthrough 280 allows for high current to pass across the boundary between rotating and stationary components. As such, the pedestal may include heating elements (not shown), and one or more of the wires 275 may be used to feed the heating elements in the pedestal 224. In some instances, the RF rotary feedthrough 280 may have a slip-ring type structure. Contacts 283 may be provided on a bottom of the stator 281. While referred to as an RF rotary feedthrough, it is to be appreciated that other electric current from 0 GHz to 100 GHz may be propagated through the RF rotary feedthrough 280. For additional details regarding pedestal 224, refer to co-pending patent application Ser. No. 17/685,272 for a "Biasable Rotating Pedestal", filed Mar. 2, 2022, and herein incorporated by reference.

Although not shown, in an alternative embodiment, the lid 110 may be configured with a showerhead plate. The shower head plate may have a central manifold and one or more outer manifolds for distributing gases into the processing region along with gases distributed by the gas injectors 118. Using the showerhead plate, additional gases may be introduced into the chamber with a vertical velocity component, but injection of gasses from one side by gas injector 118 and pumping out on other side of workpiece 106 by pump port 120 generally results in a horizontal component of gas velocity across much of the workpiece 106. Likewise, while the pump port 120 may be on a sidewall, or on an upper or lower surface of the cross-flow pumping ring 108, the pump port 120 is generally across from the injection side. Therefore, while there may be a component of velocity of exiting gas in the vertical direction, gas velocity is generally horizontal and parallel to the workpiece 106 in the processing region above workpiece 106.

Embodiments of a plasma chamber having a rotating modulated cross-flow have been disclosed.

Example embodiment 1: A plasma treatment chamber comprises a chamber body having an opening in a top surface thereof. A rotatable pedestal is within the chamber body having a support surface to hold and rotate a workpiece in a processing region. A cross-flow pumping ring is over the opening in the chamber body to inject a gas flow in a direction generally parallel to and across a surface of the workpiece. A lid is over the cross-flow pumping ring, the lid having a plurality of microwave resonators to ignite the gas flow and form plasma.

Example embodiment 2: The plasma treatment chamber of embodiment 1 wherein the plasma treatment chamber is configured to start and stop a first gas flow laterally across the workpiece in first position, rotate the workpiece to a second position, and start and stop a second gas flow laterally across the workpiece to provide a multiphase rotating cross-flow operation, the multiphase rotating cross-flow operation comprising at least a 2-phase cycle.

Example embodiment 3: The plasma treatment chamber of embodiment 2, wherein the cross-flow pumping ring further comprises a top and one or more sidewalls. A first gas injector is located in a first opening in the top or the one or more sidewalls to inject a first gas flow in a first direction generally parallel to and across a surface of the workpiece. A first pump port is located in a second opening in the top or the one or more sidewalls generally opposite the first gas injector to pump out the first gas flow.

Example embodiment 4: The plasma treatment chamber of embodiment 3, wherein the cross-flow pumping ring further comprises: a second gas injector located in a third opening in the top or the one or more sidewalls of the cross-flow pumping ring to inject a second gas flow in a second direction generally parallel to and across the surface of the workpiece, the second direction different from the first direction; and a second pump port located in a fourth opening in the top or the one or more sidewalls generally opposite of the second gas injector to pump out the second gas flow.

Example embodiment 5: The plasma treatment chamber of embodiment 3, wherein the cross-flow pumping ring further comprises: two opposing curved corners that wrap around a shape of the rotatable pedestal, and two opposing right angled corners connected to the curved corners, the two right angled corners housing the gas injector and the pump port, respectively.

Example embodiment 6: The plasma treatment chamber of embodiment 3, wherein the cross-flow pumping ring further comprises: a first cross-flow showerhead between the first gas injector and the workpiece.

Example embodiment 7: The plasma treatment chamber of embodiment 3, wherein the cross-flow pumping ring further comprises: a second cross-flow showerhead between the workpiece and the first pump port.

Example embodiment 8: The plasma treatment chamber of embodiment 6, wherein the first cross-flow showerhead includes a plurality of slots therein.

Example embodiment 9: The plasma treatment chamber of embodiment 1, wherein the rotatable pedestal further comprises: a rotation assembly to rotate the pedestal and the workpiece, and a lift mechanism to raise and lower the pedestal and the workpiece.

Example embodiment 10: The plasma treatment chamber of embodiment 1, wherein a modulating function is applied to a flow rate of the gas flow from the gas injector or to an outlet conductance caused by the pump port to approximate open/closed states or to ramp between states.

Example embodiment 11: A method of performing a rotating gas cross-flow in a plasma treatment chamber comprising microwave resonators and a rotatable pedestal. The method comprises during a first phase, injecting, by a first gas injector in a cross-flow pumping ring, a first gas flow in a first direction generally parallel to and across a surface of a workpiece on the rotatable pedestal in a first position, and pumping out, by a first pump port in the cross-flow pumping ring, the first gas flow from the cross-flow pumping ring, wherein the first gas injector is located in a first opening in the cross-flow pumping ring, and the first pump port is located in a second opening generally opposing the first gas injector. The rotatable pedestal is then rotated to rotate the workpiece a predetermined angular distance. A second phase comprises the gas injector injecting a second gas flow generally parallel to and across the surface of the workpiece, and pumping the second gas flow out by the pump port.

Example embodiment 12: The method of embodiment 11, further comprises configuring the cross-flow pumping ring with a second gas injector located in a third opening in the cross-flow pumping ring to inject the second gas flow in a second direction generally parallel to and across the surface of the workpiece, the second direction different from the first direction; and configuring the cross-flow pumping ring with a second pump port located in a fourth opening in the cross-flow pumping ring generally opposite of the second gas injector to pump out the second gas flow.

Example embodiment 13: The method of embodiment 11, further comprising: configuring the cross-flow pumping ring with two opposing curved corners that wrap around a shape of the rotatable pedestal, and two opposing right angled corners connected to the curved corners, the two right angled corners housing the first gas injector and the first pump port, respectively.

Example embodiment 14: The method of embodiment 11, further comprising: configuring the cross-flow pumping ring with a first cross-flow showerhead between the first gas injector and the workpiece.

Example embodiment 15: The method of embodiment 14, further comprising: configuring the cross-flow pumping ring with a second cross-flow showerhead between the workpiece and the first pump port.

Example embodiment 16: The method of embodiment 14, further comprising: configuring the first cross-flow showerhead with a plurality of slots therein.

Example embodiment 17: The method of embodiment 11, further comprising: configuring the rotatable pedestal with a rotation assembly to rotate the pedestal and the workpiece, and a lift mechanism to raise and lower the pedestal and the workpiece.

Example embodiment 18: The method of embodiment 11, further comprising: applying a modulating function to a flow rate of the first gas flow from the first gas injector or to an outlet conductance caused by the first pump port to approximate open/closed states or to ramp between states.

Example embodiment 19: A plasma treatment chamber comprises a chamber body having an opening in a top surface thereof. A rotatable pedestal is within the chamber body having a support surface to hold and rotate a workpiece in a processing region. A cross-flow pumping ring is over the opening in the chamber body to inject a gas flow in a direction generally parallel to and across a surface of the workpiece. A lid is over the cross-flow pumping ring, the lid having a plurality of microwave. A multiphase rotating cross-flow operation comprising at least: a first phase comprising injecting, by a gas injector in the cross-flow pumping ring, a first gas flow generally parallel to and across a surface of the workpiece, and pumping out, by a pump port in the cross-flow pumping ring, the first gas flow. The rotatable pedestal is then rotated to rotate the workpiece a predetermined angular distance. A second phase comprises the gas injector injecting a second gas flow generally parallel to and across the surface of the workpiece, and pumping the second gas flow out by the pump port.

What is claimed is:

1. A plasma treatment chamber, comprising:
   a chamber body having an opening in a top surface thereof;
   a rotatable pedestal within the chamber body having a support surface to hold and rotate a workpiece in a processing region;
   a cross-flow pumping ring mounted over the top surface of the chamber body and the opening in the chamber body to inject a gas flow in a direction generally parallel to and across a surface of the workpiece, the cross-flow pumping ring further comprising:
   two opposing curved corners that wrap around a circular shape of the rotatable pedestal, and two opposing right-angled corners connected to the two opposing curved corners, the two opposing right-angled corners providing sufficient space for housing a first gas injector and a first pump port, respectively;

a first cross-flow showerhead disposed between the first gas injector and the workpiece to distribute injected gas across the workpiece, wherein the first cross-flow showerhead includes a first plurality of slots arranged in 1) columns having a height that extends substantially a height of the cross-flow showerheads or 2) rows having a length that extends substantially a length of the cross-flow showerheads; and a second cross-flow showerhead disposed between the workpiece and the first pump port to prevent plasma from entering the first pump port, wherein the first cross-flow showerhead includes a second plurality of slots, wherein the first and second cross-flow showerheads are located on an interior bottom of the cross-flow pumping ring and extend upwards to meet an interior top portion of the cross-flow pumping ring so that the gas flow is channeled through the first and second cross-flow showerheads; and a lid over the cross-flow pumping ring, the lid having a plurality of microwave resonators to ignite the gas flow and form the plasma, and hinges that allow the lid to open and close over the cross-flow pumping ring and the rotatable pedestal.

2. The plasma treatment chamber of claim 1, wherein the plasma treatment chamber further comprises a controller configured to start and stop a first gas flow laterally across the workpiece in a first position, rotate the workpiece to a second position, and start and stop a second gas flow laterally across the workpiece to provide a multiphase rotating cross-flow operation, the multiphase rotating cross-flow operation comprising at least a 2-phase cycle.

3. The plasma treatment chamber of claim 2, wherein the cross-flow pumping ring further comprises:

a top and one or more sidewalls;

the first gas injector located in a first opening in the top or the one or more sidewalls to inject a first gas flow in a first direction generally parallel to and across the surface of the workpiece; and the first pump port located in a second opening in the top or the one or more sidewalls generally opposite the first gas injector to pump out the first gas flow.

4. The plasma treatment chamber of claim 3, wherein the cross-flow pumping ring further comprises: a second gas injector located in a third opening in the top or the one or more sidewalls of the cross-flow pumping ring to inject a second gas flow in a second direction generally parallel to and across the surface of the workpiece, the second direction different from the first direction; and a second pump port located in a fourth opening in the top or the one or more sidewalls generally opposite of the second gas injector to pump out the second gas flow.

5. The plasma treatment chamber of claim 1, wherein the rotatable pedestal further comprises: a rotation assembly to rotate the rotatable pedestal and the workpiece, and a lift mechanism to raise and lower the rotatable pedestal and the workpiece.

6. The plasma treatment chamber of claim 1, wherein a modulating function is applied to a flow rate of the gas flow from the first gas injector using a gas inlet valve on the first gas injector, or to an outlet conductance caused by a pump port using a pressure control valve on the first pump port to approximate open/closed states or to ramp between states.

7. A plasma treatment chamber, comprising:

a chamber body having an opening in a top surface thereof;

a rotatable pedestal within the chamber body having a support surface to hold and rotate a workpiece in a processing region;

a cross-flow pumping ring mounted over the top surface of the chamber body and the opening in the chamber body, the cross-flow pumping ring further comprising:

two opposing curved corners that wrap around a circular shape of the rotatable pedestal, and two opposing right-angled corners connected to the two opposing curved corners, the two opposing right-angled corners providing sufficient space for housing a first gas injector and a first pump port, respectively;

a first cross-flow showerhead disposed between the first gas injector and the workpiece to distribute injected gas across the workpiece, wherein the first cross-flow showerhead includes a first plurality of slots arranged in 1) columns having a height that extends substantially a height of the cross-flow showerheads or 2) rows having a length that extends substantially a length of the cross-flow showerheads; and a second cross-flow showerhead disposed between the workpiece and the first pump port to prevent plasma from entering the first pump port, wherein the first cross-flow showerhead includes a second plurality of slots, wherein the first and second cross-flow showerheads are located on an interior bottom of the cross-flow pumping ring and extend upwards to meet an interior top portion of the cross-flow pumping ring so that the gas flow is channeled through the first and second cross-flow showerheads;

a lid over the cross-flow pumping ring, the lid having a plurality of microwave resonators, and hinges that allow the lid to open and close over the cross-flow pumping ring and the rotatable pedestal; and a controller configured to operate a multiphase rotating cross-flow comprising at least:

a first phase comprising injecting, by the first gas injector in the cross-flow pumping ring, a first gas flow generally parallel to and across a surface of the workpiece, and pumping out, by the first pump port in the cross-flow pumping ring, the first gas flow;

rotating the rotatable pedestal to rotate the workpiece a predetermined angular distance; and a second phase comprising injecting, by the first gas injector, a second gas flow generally parallel to and across the surface of the workpiece, and pumping out, by the first pump port, the second gas flow.

\* \* \* \* \*